United States Patent
Raman et al.

(10) Patent No.: US 10,491,236 B2
(45) Date of Patent: Nov. 26, 2019

(54) OFFSET COMPENSATION CIRCUIT FOR A TRACKING LOOP

(71) Applicant: Melexis Technologies SA, Bevaix (CH)

(72) Inventors: Johan Raman, Knesselare (BE); Pieter Rombouts, Mariakerke (BE)

(73) Assignee: MELEXIS TECHNOLOGIES SA, Bevaix (CH)

( * ) Notice: Subject to any disclaimer, the term of this patent is extended or adjusted under 35 U.S.C. 154(b) by 0 days.

(21) Appl. No.: 16/277,549

(22) Filed: Feb. 15, 2019

(65) Prior Publication Data

US 2019/0260386 A1 Aug. 22, 2019

(30) Foreign Application Priority Data

Feb. 19, 2018 (EP) .................................. 18157510

(51) Int. Cl.
*H03M 3/00* (2006.01)
*H03M 1/06* (2006.01)

(52) U.S. Cl.
CPC ......... *H03M 3/356* (2013.01); *H03M 1/0607* (2013.01); *H03M 3/34* (2013.01); *H03M 3/464* (2013.01)

(58) Field of Classification Search
CPC ...... H03M 3/356; H03M 3/34; H03M 1/0607; H03M 3/464
USPC .................................. 341/118, 120, 143, 155
See application file for complete search history.

(56) References Cited

U.S. PATENT DOCUMENTS

| 7,362,255 | B1 * | 4/2008 | Tsyrganovich ......... H03M 3/34 341/155 |
| 7,502,186 | B2 | 3/2009 | Zhang et al. |
| 7,714,757 | B2 | 5/2010 | Denison et al. |
| 9,685,967 | B1 | 6/2017 | Motz et al. |
| 2007/0114988 | A1 | 5/2007 | Rossmann et al. |
| 2013/0222001 | A1 | 8/2013 | Okatake et al. |
| 2014/0368267 | A1 | 12/2014 | Motz et al. |

FOREIGN PATENT DOCUMENTS

WO  2016200637 A1  12/2016

OTHER PUBLICATIONS

Extended European Search Report from EP Application No. 18157510.1, dated Aug. 13, 2018.
Leroy et al., "Integrated Hall-Based Magnetic Platform for Position Sensing," 43rd IEEE European Solid State circuits Conference, Sep. 11-14, 2017, pp. 360-363.

* cited by examiner

*Primary Examiner* — Khai M Nguyen
(74) *Attorney, Agent, or Firm* — Workman Nydegger

(57) ABSTRACT

An offset compensation circuit comprises an error signal generation block arranged for receiving an input phase and an output phase, and for generating an error signal indicative of an error between the input phase and the output phase. Means are provided for combining the error signal with an offset compensation signal, yielding an offset compensated signal. A loop filter is arranged for receiving the offset compensated signal and for outputting the output phase. An offset compensation block is arranged for receiving the output phase and for determining the offset compensation signal. The offset compensation signal comprises at least a contribution proportional to a periodic function of the output phase.

18 Claims, 2 Drawing Sheets

OFFSET COMPENSATION CIRCUIT FOR A TRACKING LOOP

FIELD OF THE INVENTION

The present invention is generally related to the field of compensation of offset related errors in tracking loops.

BACKGROUND OF THE INVENTION

Tracking loops are used to track a phase, a position, an angle, etc., and provide as an output an estimate of this input phase, position, angle, etc. In many situations the input signals of the tracking loop are noticeably affected by offset. For instance, when the input signals are obtained from magnetic field sensing elements, they typically have an offset-related component, i.e. a component not representative of the magnetic field. Some sensing elements, e.g. horizontal and vertical Hall elements, typically have a significant offset with e.g. a magnitude comparable to or larger than the useful (magnetic-field related) signal component. Each input signal typically has an offset distinct from the offset of other input signals, but offsets may be correlated, e.g. when common causes such as stress and/or processing gradients affect the offsets. Also, front-end circuits, such as (low-noise) amplifiers, may have offsets.

Without measures being taken, the tracking loop accuracy may be severely affected by the offsets. It is known in the art that chopping may be used for separating (in frequency) offset-related components from the useful input signal components. To accomplish this, chopping makes use of modulation, e.g. with a square wave having symmetric values ±1. By separating the harmful offsets from the useful signals (in frequency), frequency selective methods, such as filtering, can be applied to reduce or eliminate the impact of offset.

Chopping is for instance applied in U.S. Pat. No. 7,714,757, disclosing a chopper-stabilized ADC comprising a modulator to modulate an amplitude of an analog input signal at a frequency to produce a modulated input signal, a mixer amplifier that amplifies the modulated input signal to produce an amplified signal and a demodulator to demodulate the amplified signal at that frequency to produce a demodulated signal.

Chopping is also applied in U.S. Pat. No. 9,685,967, disclosing a Sigma-Delta ADC comprising a forward path with analog chopper circuitry. Chopping may be accomplished by modulation with an analog carrier, e.g. $\cos(2\pi f_c t)$ with $f_c$ a chopping frequency. In induction-based position sensors the chopping operation may be due to the modulation caused by an excitation signal applied to an excitation coil.

It is known in the art that chopped output signals can be obtained from a Hall element (HE) by means of spinning (also referred to as current spinning). In this case the contacts of a Hall element are biased and read out in different arrangements. These arrangements are obtained by switching biasing and readout to particular contacts. A result of a particular type of spinning is that the differential signal appearing at the spinning readout switches comprises a low-frequency (quasi DC) offset component and a signal component responsive to a magnetic field up-modulated to higher frequencies according to a chopping frequency related to the spinning frequency (i.e. the frequency with which one cycles from one spinning phase to the next). As a result of a particular spinning scheme, the Hall element signals may, for instance, be representable as $$HE_k(\theta_k) = c(n)AS_k(\theta_k) + O_K \quad k=0,1,\ldots,N-1 \quad (1)$$

wherein $S_k$ is a signal representative of an input signal of the tracking loop, for instance represented as $$S_k(\theta_i) = \cos\left(\theta_i - k\frac{2\pi}{N}\right) \quad k = 0, 1, \ldots, N-1 \quad (2)$$

and wherein $c(n)=(-1)^n$ denotes the modulation function associated with the spinning scheme, A denotes an amplitude of the Hall element signals and $O_k$ represents an offset of the $k^{th}$ sensing element. The integer n is used for referring to the $n^{th}$ time slot during which sensor signals are being read out. An advantage of this particular spinning scheme is that the offset $O_k$ in expression (1) may combine with an offset of a front-end circuit that follows thereafter, both offsets being essentially at DC. Therefore, the effect of offset of the front-end circuits can be taken into account by considering the $O_k$ to be the combination of a Hall-element offset plus an input-referred offset of the front-end circuit. Therefore, also the front-end related offset sources can be handled by the same spinning/chopping scheme applied for readout of the Hall elements.

In the abovementioned examples, at some later point in the signal chain, a second chopper is applied for demodulating the useful signal to baseband and at the same time up-modulating the unwanted offset contributions to higher frequencies. When the modulation function assumes only the values ±1, demodulation can be accomplished using the same modulation function $c(n)$ associated with the spinning scheme.

It is not required to apply the same spinning scheme to the different Hall elements. For instance, when one Hall plate cycles through a sequence of spinning phases (e.g. 0, 1, 2, 3, ...) another Hall plate may cycle through a delayed or advanced sequence (e.g. 2, 3, 0, 1, ...). Also, the direction of cycling through the spinning phases can be altered (e.g. 2, 1, 0, 3, ...).

In classical angle architectures offsets on sensed signals may be removed prior to an angle calculation. Such a solution cannot be easily applied in a tracking loop, especially when many sensing signals are involved.

Hence, there is a need for an offset compensation circuit that is suited for use in a tracking loop.

SUMMARY OF THE INVENTION

It is an object of embodiments of the present invention to provide for an offset compensation circuit that allows for dynamic compensation of offset-related errors in a tracking loop.

The above objective is accomplished by the solution according to the present invention.

In a first aspect the invention relates to an offset compensation circuit comprising an error signal generation block arranged for receiving an input phase and an output phase and for generating an error signal indicative of an error between said input phase and said output phase, combiner means configured to combine said error signal with an offset compensation signal, yielding an offset compensated signal, a loop filter arranged for receiving said offset compensated signal and for outputting said output phase, an offset compensation block arranged for receiving said output phase and for determining said offset compensation signal, said offset compensation signal comprising at least a contribution proportional to a periodic function of said output phase.

The proposed solution indeed allows for offset error compensation due to the presence of the offset compensation block. This block is capable of determining an offset compensation signal, based on the output phase of the loop. More in particular, a periodic function of the output phase is exploited for determining at least one contribution of the offset compensation signal. Optionally, the offset compensation signal contains more contributions, which may also be proportional to some periodic function of the output phase or not.

In preferred embodiments the error signal generation block is a combiner circuit arranged to generate the error signal by combining a plurality of input signals each having a phase related to said input phase according to an array of weight factors determined based on the output phase.

Such embodiments of the offset compensation circuit may comprise one or more sensors for providing sense signals as input signals, each having a phase related to a position and/or an angle. The circuit may then advantageously comprise a controller to control a scanning sequence of the sensors, e.g. the powering or the biasing and/or the sensing. In specific embodiments the sensors are Hall plates. The controller then may control the Hall plate spinning. This Hall plate spinning may provide a first chopping operation for separating the magnetic signals from offset. This can also be a circular vertical Hall device in which the multitude of contacts is scanned in a regular fashion.

In another embodiment the error signal generation block is a phase detector.

In an advantageous embodiment the offset compensation block comprises a digital-to-analog converter. This allows generating the offset compensation signal from a digital version thereof.

In preferred embodiments the offset compensation circuit comprises chopping means arranged for applying a chopper signal to the offset compensated signal. The offset compensation block is then advantageously arranged to receive the chopper signal.

In other embodiments the offset compensation block comprises internal chopping means.

In embodiments the offset compensation block comprises filtering means.

In further embodiments the loop filter comprises an amplifier and/or an analog filter. The loop filter comprises in certain embodiments an analog-to-digital converter.

Preferably the offset compensation block comprises a plurality of adaptive paths, each yielding a contribution to said offset compensation signal.

In preferred embodiments the offset compensation block is arranged to receive a further input signal branched at a point downstream from said error signal generation block. Advantageously, the offset compensation block is arranged for receiving an output of the analog-to-digital converter.

In embodiments the offset compensation block comprises a non-linear scaling block. Such block can make the adaptation rate of at least some of the adaptive paths signal-dependent. In embodiments the offset compensation block is arranged for estimating parameters of one or more of the adaptive paths.

In one embodiment the offset compensation signal is at least in part determined based on calibration data.

In another aspect the invention also relates to an offset compensation circuit comprising an error signal generation block arranged for receiving one or more sinusoidal input signals which are periodic functions of an input phase and an equal number of feedback signals which are periodic functions of an output phase and for generating an error signal indicative of an error between said input phase and said output phase, combining means to combine said error signal with an offset compensation signal, yielding an offset compensated signal, a loop filter arranged for receiving said offset compensated signal and for deriving from said offset compensation signal said output phase, an offset compensation block arranged for receiving said output phase and for determining said offset compensation signal, said offset compensation signal comprising at least a contribution proportional to a periodic function of said output phase.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

The above and other aspects of the invention will be apparent from and elucidated with reference to the embodiment(s) described hereinafter.

BRIEF DESCRIPTION OF THE DRAWINGS

The invention will now be described further, by way of example, with reference to the accompanying drawings, wherein like reference numerals refer to like elements in the various figures.

DETAILED DESCRIPTION OF ILLUSTRATIVE EMBODIMENTS

Figure 1:
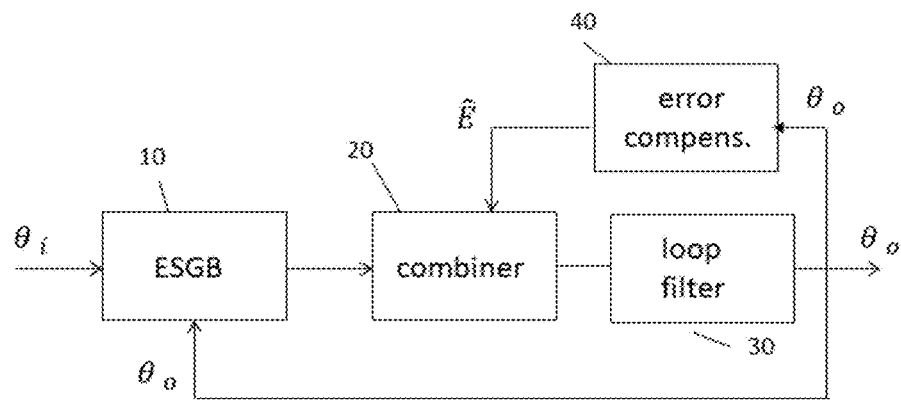
FIG. 1 illustrates a general scheme of the offset compensation circuit according to the present invention.

The present invention will be described with respect to particular embodiments and with reference to certain drawings but the invention is not limited thereto but only by the claims.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

It should be noted that the use of particular terminology when describing certain features or aspects of the invention should not be taken to imply that the terminology is being re-defined herein to be restricted to include any specific characteristics of the features or aspects of the invention with which that terminology is associated.

In the description provided herein, numerous specific details are set forth. However, it is understood that embodiments of the invention may be practiced without these specific details. In other instances, well-known methods, structures and techniques have not been shown in detail in order not to obscure an understanding of this description.

The present invention proposes an offset compensation circuit for a tracking loop, wherein offset related errors can be compensated for in a dynamic way.

The tracking loop considered in the present invention may relate to a position sensor. Position may refer to a linear displacement, a rotation angle, etc. With the position to be measured, an input phase $\theta_i$ is associated. The position sensor may be an angular sensor, in which case the input phase $\theta_i$ may be the same as the mechanical rotation angle $\theta_{mech}$, i.e. $\theta_i = \theta_{mech}$, or a (linear) function of the mechanical rotation angle, e.g. $\theta_i = k \cdot \theta_{mech} + \varphi_0$ with k some proportionality factor, and $\varphi_0$ the phase at a zero position. The position sensor may be a linear displacement sensors, in which case the input phase $\theta_i$ may be a linear function of the mechanical displacement $x_{mech}$, e.g. $\theta_i = k \cdot x_{mech} + \varphi_0$ with k some proportionality factor and $\varphi_0$ the phase at a zero position.

The position sensor may be a magnetic position sensor which, for instance, measures the displacement of a magnetic field w.r.t. the position sensor or the angle of a magnetic field relative to the sensor orientation. In these magnetic position sensors the magnetic field may be generated by a magnet or by an excitation coil. In magnetic position sensors the sensing elements may be based on horizontal or vertical Hall elements, GMR or TMR sensing elements, etc. This may be in combination with a magnetic layer (e.g. an integrated layer or IMC) that locally alters the magnetic field, e.g. change its direction, e.g. from an in-plane magnetic field to a vertical magnetic field. Magnetic position sensor may also rely on an angle-dependent mutual inductance between a driving coil and one or more sense coils, for instance an electrical resolver.

A tracking loop keeps track of an external displacement/angle in an incremental way, based on comparing a "predicted" output to the actual phase/position/angle. Such tracking loops can cope better with non-stationary situations, e.g. in which the position/angle change continuously with time. This occurs frequently with (electrical) motors, where the rotation angle of the rotor typically changes with a relatively constant but possibly high speed and thus the actual angle increases linearly with time. In such applications, tracking loops may, for instance, be beneficially used for providing a near-zero latency output (i.e. an output phase/position/angle with small error, even when the input phase/position/angle changes with high (angular) speed) or for providing filtering, e.g. for suppressing noise.

The tracking loop in present invention has one or more (N≥1) input signals representative for the input phase/position/angle $\theta_i$. The input signal(s) of the tracking loop may, for instance, be represented as in expression (2). In a more general case the $S_k(\theta_i)$ are periodic functions (as a function of $\theta_i$). Also, extra scale factors representative of the amplitude of the input signals may be present.

When the tracking loop in this invention relates to sensors, the input signals may be analog sensing signals obtained from sensing elements. It is to be noted that although in the rest of this description the explanation is provided with reference to a plurality of sensors, it will be apparent to the skilled person that the invention is equally applicable when each sensor is read out sequentially and the input signals are obtained one-by-one.

In the magnetic case the sensing element signals (2) can also be interpreted as projections of the magnetic field in different directions, e.g. along the directions identified by the angles $k \cdot 2\pi/N$ for $k=0, 1, \ldots, N-1$. When also a magnetic layer is involved, the shape of the magnetic layer may be chosen to obtain projections (2). While in (2) the "projection angles" $k \cdot 2\pi/N$ are regularly placed, this is not required.

A tracking loop may be implemented completely in the digital domain, e.g. to provide digital filtering without adding extra latency. The input signals representing the input phase/position/angle $\theta_i$ may be digital input signals. Digital tracking loops may also be applied in combination with analog input signals, e.g. analog sensing element signals. In such cases the analog input signals need to be converted to the digital domain prior to being fed into the tracking loop. In such cases the analog-to-digital conversions introduce a latency which is not compensated by the tracking loop.

A tracking loop may also operate more directly on analog input signals. This can bring various advantages. The latency can so be reduced compared to a digital tracking loop, because no analog-to-digital conversions are needed outside (prior to) the feedback loop for converting the input signals. Further, only a single signal path is present, comprising (at most) a single ADC. The latency of the loop filter and ADC (if present) are in the forward path of the loop and do not affect the input-output latency of the tracking loop. The noise performance can possibly be improved, because quantization noise due to ADC converting individual input signals and/or noise aliasing due to sampling of the individual input signals is avoided. Tracking loops operating on analog input signals may also be adapted to provide a digital output signal indicative of the input phase/position/angle.

In certain embodiments of the present invention a tracking loop is considered based on a classical phase detector. An example can be taken from a signal obtained by scanning a circular array of vertical Hall elements. A model of this input signal, including offsets of the scanned sensing elements, can be written as $$x(t) = \left[ A \cos\left(\theta_i - k\frac{2\pi}{N}\right) + O_{k \,(mod\, N)} \right]_{k=\lfloor Nt/T_{scan} \rfloor}$$

wherein $\lfloor x \rfloor$ denotes the closest integer value $\leq x$, $T_{scan}$ is the time for doing a complete scan of all elements and N is the number of elements. $O_k$ (with k=0, 1, ..., N−1) represents the individual offsets of the Hall elements. In this scheme a feedback signal is generated by an oscillator. The oscillator is responsive to a clock (related to the scanning frequency) that defines increments with a constant phase. The generated feedback signal has a phase representative of the output phase $\theta_o$. The feedback signal generated by the oscillator can be modelled as follows $$y(t) = \left[ -\sin\left(\theta_o - k\frac{2\pi}{N}\right) \right]_{k=\lfloor Nt/T_{scan} \rfloor}$$

For a traditional multiplier-based phase detector followed by a filter that suppresses higher (double) frequency terms, the phase detector output can be modelled as $$PD_{OUT} = \frac{1}{T_{scan}} \int_0^{T_{scan}} x(t)y(t)dt + V_0 \qquad (3)$$

$$= \underbrace{\frac{A}{2}\sin(\theta_i - \theta_o)}_{f(\theta_i - \theta_o)} + \underbrace{V_0 - \frac{1}{N}\sum_{k=0}^{N-1} O_k \sin\left(\theta_o - k\frac{2\pi}{N}\right)}_{E} \qquad (4)$$

$V_0$ herein represents an overall offset of the phase detector, which is a non-zero output that occurs when all input signals are zero. The first term in the above equation can be related to the useful phase detector output signal $f(\theta_i - \theta_o)$ of the tracking loop. The other terms represent the impact of the various offsets on the output of a classical phase detector. This can be identified as an additive error contribution E. Based on trigonometric relations, it can be shown that the phase detector error component E can be grouped into three components:

$$E = V_0 + V_1 \cos\theta_o + V_2 \sin\theta_o \qquad (5)$$

with $$\begin{cases} V_1 = \sum_{k=0}^{N-1} \sin\left(k\frac{2\pi}{N}\right) O_k \\ V_2 = -\sum_{k=0}^{N-1} \cos\left(k\frac{2\pi}{N}\right) O_k \end{cases} \qquad (6)$$

Equation (5) provides a compact form summarizing the impact of the various offsets on the phase detector output. This shows that the various offsets cause an additive error term in the phase detector output, which varies with the output phase/position/angle in a periodic way. The three coefficients $V_0$, $V_1$ and $V_2$ are all representable as linear combinations of the different offset contributions ($V_0$, $O_0$, $O_1$, ..., $O_{N-1}$).

In a tracking loop with classical phase detectors the phase detector operates on two input signals, being an input signal with a phase representative for an input phase/position/angle $\theta_i$, and a feedback signal with a phase representative for the output phase/position/angle $\theta_o$ of the tracking loop. In other embodiments of the present invention a different type of tracking loop is considered, which makes use of a combiner circuit arranged to receive a multitude (N≥2) of input signals, each with a phase representative of the input phase/position/angle $\theta_i$, and a multitude (N≥2) of feedback signals, each with a phase representative of an output phase/position/angle $\theta_o$ provided by the tracking loop. The combiner circuit provides a measure of the difference between the input phase/position/angle $\theta_i$ and the output phase/position/angle $\theta_o$ by making a linear combination of the N input signals. The weights $G_k$ used in this combination are—by construction—function of the output angle $\theta_o$, i.e. $G_k = G_k(\theta_o)$. The combiner applies the weights to the individual input signals of the tracking loop and combines (e.g. adds) these weighted contributions to produce an output representative for the phase/position/angle difference. Mathematically this can for instance be expressed as $$COMB_{OUT} = \sum_{k=0}^{N-1} G_k(\theta_o)HE_k(\theta_i) + V_0 \qquad (7)$$

In this expression, an additive term $V_0$ has been added to represent a possible offset of the combiner circuit itself. Assuming the model (1) for the tracking loop input signals, the output of the combiner circuit can be evaluated as:

$$COMB_{OUT} = \underbrace{c(n)A\sum_{k=0}^{N-1} G_k(\theta_o)S_k(\theta_i)}_{f(\theta_i - \theta_o)} + \underbrace{V_0 + \sum_{k=0}^{N-1} G_k(\theta_o)O_k}_{E} \qquad (8)$$

By construction, that is by proper choice of the weight coefficients, one can make the first term correspond to a measure of the difference between the input phase/position/angle $\theta_i$ and the output phase/position/angle $\theta_o$, which is also here referred to as $f(\theta_i - \theta_o)$. This is for instance the case when the functions $G_k$ are determined as $$G_k(\theta) = \frac{d}{d\theta}\left( \frac{S_k(\theta)}{\sqrt{\frac{2}{N}\sum_{k=0}^{N-1} S_k^2(\theta)}} \right), k = 0 \ldots (N-1) \qquad (9)$$

It can be shown that for this choice the signal-to-noise ratio of the combiner output signal is optimized. In general, all $S_k(\theta)$ are periodic functions and have a common period. The above expression (9) shows that the corresponding gain functions $G_k(\theta)$ also have this periodicity.

The other terms that appear in (8) define an offset-related error component:

$$E = V_0 + \sum_{k=0}^{N-1} G_k(\theta_o) O_k \quad (10)$$

Based on the periodicity of all the weight functions $G_k$, it can be concluded from the above expression that the error component E is also periodic as a function of the output phase/displacement/angle $\theta_o$.

A special case is when the Hall elements are distributed evenly in a circular arrangement and the tracking loop input signals are sensing signals given by (1). The weights (10) are in this case simple trigonometric functions depending on the output angle:

$$G_k = -\sin\left(\theta_o - k\frac{2\pi}{N}\right) \quad (11)$$

which confirms the general property that these weights are periodic functions of $\theta_o$. In this case, the offset related error component of the combiner circuit (11) becomes identical to the offset-related error component of the traditional phase detector (4). Hence the combiner output and the phase detector output (average level over one scanning period) are both corrupted by an additive offset-related error modelled by (5) and (6).

Above it has been shown that the effect of the different offsets can be merged in an expression having a limited number of terms, e.g. expression (5). The present invention proposes to inject a compensating signal of similar form in the tracking loop. An advantage of the invention is that it provides a compensation which is able to "track" changes due to offset-drift (i.e. offset-related effects that change relatively slowly over time) with accurate, low-bandwidth adaptive loops, while the error compensation signal can still effectively cancel various fast changing error components in E, e.g. caused by fast changes in the input and/or output phase.

A general scheme of an offset compensation circuit according to the invention is depicted in FIG. 1. An input phase/position/angle $\theta_i$ is fed to an error signal generating block (10). As a second input signal the error signal generating block receives the output phase $\theta_o$ which is fed back from the output of the circuit. The resulting signal produced by the error signal generating block is a function of the difference between $\theta_i$ and $\theta_o$. This resulting signal is, however, also affected by various offset sources. In a combining means (20) the resulting signal is combined with an error compensation signal output by an error compensation block. This combining is typically a subtraction, but it may also be an addition, e.g. depending on various sign choices being made in the error generation block, and it may involve other functions, e.g. involving a same or a different scale factor being applied to the combiner input signals or even a same or a different filter operation being performed on the combiner input signals. The offset compensated signal then goes into a loop filter (30) that outputs an output phase $\theta_o$. This output phase $\theta_o$ is applied to the error compensation block (40) and is also fed back to the error signal generating block.

Figure 2:
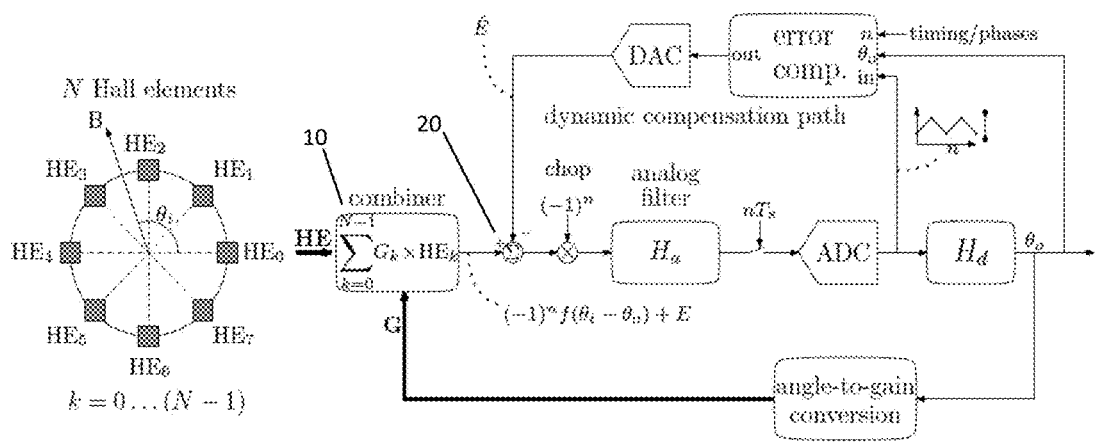
FIG. 2 illustrates an embodiment with a combiner circuit.

FIG. 2 shows an exemplary phase/position/angle tracking loop with dynamic compensation of offset-related errors in accordance with present invention. In this embodiment a combiner circuit is used as error signal generation block. Apart from the combiner circuit, the tracking loop comprises means for subtracting the error compensation signal, chopping means, an analog filter $H_a$, an analog-to-digital converter, a digital filter $H_d$, and an angle-to-gain conversion block. As discussed above, the combiner circuit output has, next to the wanted output component representative for the difference, also an unwanted offset-related error component E. For the case with N regularly spaced sensing elements, the wanted output component may be represented as $f(\theta_i - \theta_o) = N/2 \cdot A \sin(\theta_i - \theta_o)$. The offset-related error is compensated by injecting a counteracting compensation signal E after the combiner circuit, thus reducing or even eliminating the unwanted error component and preventing the tracking loop performance being affected by it. This counteracting signal may comprise components similar to those appearing in the derived model of the error component, e.g. (5), but not all components need to be present. The compensation signal may therefore be represented as:

$$\hat{E} = \hat{V}_0 + \hat{V}_1 \cos \theta_o + \hat{V}_2 \sin \theta_o \quad (12)$$

in which $\hat{V}_0$, $\hat{V}_1$, and $\hat{V}_2$ either represent an estimated parameter (e.g. estimated based on calibration data and/or resulting from an adaptive loop as will be discussed hereafter), or are set to zero (when the term is not to be included in the compensation signal). In the embodiment of FIG. 2 the compensation signal is generated in the digital domain and then converted to the analog domain through a digital-to-analog converter (DAC). In case $\theta_o$ is quantized, the signals $\cos \theta_o$ and $\sin \theta_o$ may be digitally stored, e.g. in a lookup table. Also, the different values of $\cos \theta_o$ and $\sin \theta_o$ may be quantized and/or rounded, e.g. for reducing the amount of hardware needed to generate the compensation signal.

A complete compensation would be accomplished if $\forall m$: $\hat{V}_m = V_m$. Therefore one would like to have good estimates $\hat{V}_m$ available which are close to the real offset-related magnitudes $V_m$. Unfortunately, the offset-related magnitudes $V_m$ are not static and typically vary significantly with temperature. The offset-related magnitudes $V_m$ also drift with time due to various reasons, such as aging or changing stress levels exerted by a package.

One approach to determine the estimates $\hat{V}_m$ is based on calibration. Calibration data typically needs to be obtained for a number of temperatures. During operation, an estimate $\hat{V}_m(T)$ corresponding to the actual temperature T needs to be derived from the calibration data. Unfortunately, the drift-related phenomena mentioned above are difficult to cover by a calibration approach. It is therefore an advantage of the dynamic feedback loop described in the present invention that estimates (for most) of the $\hat{V}_m$ may be provided that can "track" the actual variations of the offset-related magnitudes $V_m$. In the exemplary embodiment the functionality for adapting the estimates $\hat{V}_m$ is part of the error compensation block (ECB). The overall operation of the loop for dynamically adapting $\hat{V}_m$ will be explained hereafter.

The signal appearing after the demodulator (in the forward path of the main tracking loop of FIG. 2) can be written as:

$$f(\theta_i - \theta_o) + (-1)^n (E - \hat{E}) \quad (13)$$

in which $f(\theta_i-\theta_o)$ represents the useful signal associated with the tracking loop operation. Assuming a compensation based on a set of values $\hat{V}_m$, the signal after the demodulator can be expressed as:

$$f(\theta_i-\theta_o)+(-1)^n[(V_0-\hat{V}_0)+(V_1-\hat{V}_1)\cos\theta_o+(V_2-\hat{V}_2)\sin\theta_o] \quad (14)$$

The offset-related terms are at a different frequency compared to the baseband signal $f(\theta_i-\theta_o)$, due the applied spinning/chopping scheme. This allows driving the offset-related terms to zero in a way largely orthogonal to the operation of the main loop.

In the exemplary embodiment of FIG. 2 the demodulated signal of expression 14 is filtered by an analog filter, e.g. an analog integrator, but this is not absolutely required. Also, an ADC is used for conversion to the digital domain, which is convenient for flexible processing, but this is also optional. While an analog filter (if present) may introduce different gains for each of the components in equation (14) (depending on the frequency at which they are located), this does not prevent observing the offset-related components and using this for adapting the $\hat{V}_m$ in order to drive these to zero.

Figure 3:
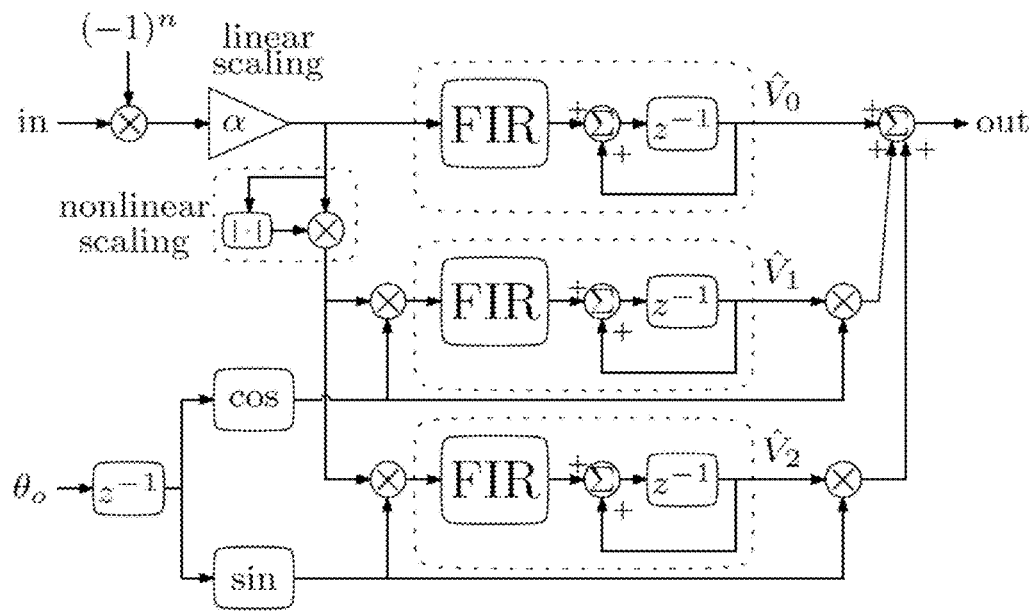
FIG. 3 illustrates a possible implementation of the offset compensation block.

An exemplary implementation of the error compensation block (ECB) (40) is shown in FIG. 3. This block receives as a first input (indicated "in" in the figure) a signal from the tracking loop which is situated downstream (i.e. farther away from the input of the tracking loop in the scheme) of the injection point where the error compensation is applied. This tracking loop signal may, for instance, be a signal directly after the injection point, a demodulator output, an analog filter output, an output of an analog-to-digital converter, a digital filter output or any signal from the tracking loop which comprises traces of a residual offset, e.g. being indicative of a difference $\hat{V}_m-V_m$, preferably at a frequency distinct from the normal frequencies associated with the operation of the tracking loop.

The error compensation block (ECB) may be provided with means for chopping (at one or more locations). For each chopper the corresponding chopping signal may come from a source external to the ECB, e.g. a chopping signal being used in the main tracking loop. The corresponding chopping signal may also be generated in the ECB, e.g. based on timing signals and/or signals linked to an applied spinning scheme (i.e. a sequence of spinning phases). In the embodiment shown in FIG. 3, a chopper is present having the chopper signal $(-1)^n$ which is also used as a chopping signal in the main tracking loop. This chopper (de)modulates the "in" signal having the form as in expression (14), hence the chopped "in" signal has the form:

$$(-1)^n f(\theta_i-\theta_o)+(V_0-\hat{V}_0)+(V_1-\hat{V}_1)\cos\theta_o+(V_2-\hat{V}_2)\sin\theta_o \quad (15);$$

This chopped "in" signal can be filtered to extract the low-frequency content while suppressing the components at higher frequencies, thus providing a filtered output signal $F_0$. Such a filter may be an IIR filter and/or an FIR filter, preferably having a notch at the chopping frequency and/or half the chopping frequency. Simple FIR filters with useful notch frequencies are $(1+z^{-1})/2$ (having a notch at the chopping frequency) and $(1+z^{-1}+z^{-2}+z^{-3})/4$ (having notches at the chopping and at half the chopping frequency). The filtered output $F_0$ may then provide a measure of, for instance, $V_0-\hat{V}_0$. Since the current value $\hat{V}_0(n)$ of $\hat{V}_0$ is known, a measure of $V_0-\hat{V}_0$ allows updating the value of $\hat{V}_0$ such that the error $\hat{V}_0-V_0$ becomes smaller. A common adaptation rule to accomplish this is as follows:

$$\hat{V}_0(n+1)=\hat{V}_0(n)+\alpha F_0(n) \quad (16)$$

with $\alpha$ an adaptation parameter controlling the adaptation rate. It can be seen that when $F_0(n) \approx V_0-\hat{V}_0(n)$ and when a is sufficiently small (to ensure stability), $\hat{V}_0$ converges to $V_0$. The adaptation rule (16) can also be interpreted as a linear scaling (with factor $\alpha$) followed by an integration. The output of the integrator provides the current estimate $\hat{V}_0$.

An exemplary implementation using the above functional blocks for implementing a dynamical/adaptive error compensation loop appears in FIG. 3. The top signal path comprises (de)modulation of "in" with a chopping signal $(-1)^n$, linear scaling with factor $\alpha$, an FIR low-pass filter and an integrator (whose output may represent the current estimate $\hat{V}_0$).

Now the situation is considered where only the $\hat{V}_0$ term of the actual error component of expression (5) is used as an error compensation signal. This corresponds to only using the adaptive path discussed above (i.e. only the top path of FIG. 3). $\hat{V}_0$ turns out to be able to track the "full" error (5)—hence not only the constant term $V_0$—provided $\theta_o$ changes slowly. More accurately, $\theta_o$ should change slowly compared to the adaptation rate of expression (16). However, in practice, the adaptation parameter a is often taken small to reduce the amount of noise and disturbances affecting the estimate $\hat{V}_0$, which results in slow adaptation. Another reason to take a small value for a is to safeguard the stability of the dynamic error compensation loop, especially when (analog) filters are present in the adaptation loop.

In some important applications $\theta_o$ may change abruptly and/or may increase/decrease significantly as a function of time (which is a typical usage case of the considered tracking loops). Based on the error model of expression (5), one can see that this results in fast changing error terms. In contrast, the actual model coefficients $V_m$ are all linear functions of offsets which change only slowly over time. Therefore, multiple coefficients may be introduced, for instance $\hat{V}_0$, $\hat{V}_1$ and $\hat{V}_2$, and a compensation signal may be defined according to equation (12). Here, the adaptive coefficients $\hat{V}_0$, $\hat{V}_1$ and $\hat{V}_2$ only need to "track" the slowly changing offset-related variables $V_0$, $V_1$ and $V_2$. Therefore, an advantage of the proposed circuit is that the dynamic error correction may be based on adapting coefficients $\hat{V}_m$, which only vary slowly over time, but are associated with a term which may vary significantly faster due to changes in the angle $\theta_i$. This allows using slower adaptive loops, which can have a better suppression of noise and interfering signals and leads to dynamic loops with a better stability.

Now two additional adaptive loops are introduced for updating $\hat{V}_1$ and $\hat{V}_2$, which are similar to the adaptive loop already discussed. These loops are represented by the two lower paths in FIG. 3. In these extra loops there is an extra modulation with the signals $\cos\theta_o$ and $\sin\theta_o$ prior to averaging and integration, and the integrator outputs represent the estimates $\hat{V}_1$ and $\hat{V}_2$, respectively. These estimates are then multiplied with $\cos\theta_o$ and $\sin\theta_o$ and the three components are added to obtain the "out" signal used for the error compensation. A number of delays may also be present in the ECB, for instance to compensate for a delay of the "in" signal, for instance due to the delay of an ADC (as is present in FIG. 2).

If $\theta_o$ does not change, the three terms in expression (12) are not separated in frequency (they all are at DC then). Under such conditions the three adaptive paths cannot be considered orthogonal to each other. This means the three loops may react to a change of only one of the error components in equation (5). This is different when $\theta_o$ changes significantly, since then the three terms (12) may be considered orthogonal to each other.

With more than one adaptive path present, there may be interactions between the different paths, which may, for instance, have an effect on the convergence of the estimates $\hat{V}_0$, $\hat{V}_1$ and $\hat{V}_2$ to the actual values $V_0$, $V_1$ and $V_2$. The convergence behaviour may be improved, e.g. by adding a non-linear scaling block. An example of such a non-linear scaling block is shown in FIG. 3. This block has a non-linear input-output characteristic $y=x\cdot|x|$. The purpose of this block can be understood as follows. It was already mentioned that the top path can follow the full error component E when $\theta_o$ remains constant or changes only slowly. For these slow changes the adaptation error $F_0$ remains relatively small, e.g. smaller than one. The output of the non-linear scaling block is then even smaller, which largely disables the adaptation of the bottom two loops. However, when $\theta_o$ changes significantly, the top path is too slow to adapt to the fast-changing errors. As a result, the adaptation error $F_0$ will then be larger, e.g. larger than one. The output of the non-linear scaling block is then even larger, and so the adaptation rate of the two bottom paths is boosted relative to the top path. In this situation the parameters $\hat{V}_1$ ($\hat{V}_2$, respectively) are quickly adapted toward their real values $V_1$ ($\hat{V}_2$, respectively). As these estimates start reaching the real values $V_1$ ($\hat{V}_2$, respectively), the fast-changing error components are progressively cancelled, and the adaptation error $F_0$ drops back to lower levels. Hence, an advantage of the non-linear scaling block is that the lower two loops are mainly activated when $\theta_o$ changes significantly, which are precisely the conditions wherein the different components in (12) tend to act in an orthogonal way. It should be understood that while a non-linear scaling block might help improving the convergence in specific conditions, the presence of this block is in general not required.

More generally, estimates for any of the parameters may be obtained by minimizing the expected and/or averaged value of (15), e.g. in a mean square sense. A number of well-known adaptive strategies exist to accomplish this minimization, e.g. Stochastic Gradient Descent (also known as incremental gradient descent), Also, extensions of these methods for changing the adaptation parameter a in a signal-dependent way, e.g. to improve convergence are known in the field ("adaptive learning rate").

In the model of expression (1) $O_k$ has been introduced as a constant representative for the offset. However, it is known in the art that the offset may depend to some extent on the spinning phase, e.g. due to non-linearity of the sensing element. When a repetitive four-phase spinning scheme is applied, the offset is a regular repetition of four offset values: $V_{off,k}^{(0)}$, $V_{off,k}^{(1)}$, $V_{off,k}^{(2)}$ and $V_{off,k}^{(3)}$. An equivalent model for the offset as a function of the time index n is:

$$O_k+d(n)X_k+c(n)d(n)Y_k+c(n)Z_k \quad (17)$$

With $$c(n) = (-1)^n \quad d(n) = \sqrt{2}\cos\left(n\frac{\pi}{2} - \frac{\pi}{4}\right) \quad (18)$$

The model values $O_k$, $X_k$, $Y_k$ and $Z_k$ can be obtained as:

$$\begin{cases} O_k = \dfrac{V_{off,k}^{(0)} + V_{off,k}^{(1)} + V_{off,k}^{(2)} + V_{off,k}^{(3)}}{4} \\ X_k = \dfrac{V_{off,k}^{(0)} + V_{off,k}^{(1)} - V_{off,k}^{(2)} - V_{off,k}^{(3)}}{4} \\ Y_k = \dfrac{V_{off,k}^{(0)} - V_{off,k}^{(1)} - V_{off,k}^{(2)} + V_{off,k}^{(3)}}{4} \\ Z_k = \dfrac{V_{off,k}^{(0)} - V_{off,k}^{(1)} + V_{off,k}^{(2)} - V_{off,k}^{(3)}}{4} \end{cases} \quad (19)$$

which demonstrates the model parameters $O_k$, $X_k$, $Y_k$, and $Z_k$ are simple linear combinations of offset values occurring in different spinning phases. Replacing the offsets $O_k$ in the model (1) with the more accurate offset expression (17), one can again evaluate the output of the combiner circuit according to (7), which further allows identifying a more accurate error component:

$$E=V_0+V_1\cos\theta_o+V_2\sin\theta_o+d(n)[V_3\cos\theta_o+V_4\sin\theta_o]+c(n)d(n)[V_5\cos\theta_o+V_6\sin\theta_o]+c(n)[V_7\cos\theta_o+V_8\sin\theta_o] \quad (20)$$

with $V_1$ and $V_2$ already defined by (6), and $$\begin{cases} V_3 = \sum_{k=0}^{N-1} \sin\left(k\frac{2\pi}{N}\right)X_k \\ V_4 = -\sum_{k=0}^{N-1} \cos\left(k\frac{2\pi}{N}\right)X_k \\ V_5 = \sum_{k=0}^{N-1} \sin\left(k\frac{2\pi}{N}\right)Y_k \\ V_6 = -\sum_{k=0}^{N-1} \cos\left(k\frac{2\pi}{N}\right)Y_k \\ V_7 = \sum_{k=0}^{N-1} \sin\left(k\frac{2\pi}{N}\right)Z_k \\ V_8 = -\sum_{k=0}^{N-1} \cos\left(k\frac{2\pi}{N}\right)Z_k \end{cases} \quad (21)$$

This error can be written more compactly as $$E = V_0 + \sum_{m=1}^{M} V_m \times w_m \times P_m(\theta_o) \quad (22)$$

whereby
 $\forall_m \in \{0, 1, \ldots, M\}$: $V_m$ is a coefficient depending on the multitude of offsets appearing in the system
 $\forall_m \in \{1, \ldots, M\}$: $w_m$ is a constant, e.g. one, or a modulation function that changes over time, e.g. c(n) or d(n) as defined in (18), or combinations thereof, e.g. c(n)d(n)
 $\forall_m \in \{1, \ldots, M\}$: $P_m(\theta_o)$ is a periodic function of the output angle $\theta_o$, e.g. $\cos\theta_o$ or $\sin\theta_o$.

In a more general case $w_m$ may also be any repetitive sequence of ±1, a pseudo-random sequences of ±1, etc. Also, $P_m(\theta_o\_o)$ may be a periodic function representing higher harmonics as a function of $\theta_o$, e.g. $\cos(2\theta_o)$, $\sin(2\theta_o)$, $\cos(3\theta_o)$, $\sin(3\theta_o)$, etc.

Exploiting this more accurate model to represent the offset-related error component that appears at the output of the (classical) phase detector or combiner circuit, this error can now be compensated by injecting a counteracting signal comprising components similar to those appearing in the derived model of the error component, e.g. (22), but not all components need to be present. The compensation signal may therefore be represented as:

$$\hat{E} = \hat{V}_0 + \sum_{m=1}^{M} \hat{V}_m \times w_m \times P_m(\theta_o) \quad (23)$$

in which $\forall_m \in \{0, 1, \ldots, M\}$ $\hat{V}_m$ either represents an estimated or adaptive parameter or $\hat{V}_m$ is set to zero (when the term is not to be included in the compensation signal). The "in" signal of the ECB then has the form:

$$f(\theta_i - \theta_o) + (-1)^n \left[ (V_0 - \hat{V}_0) + \sum_{m=1}^{M} (V_m - \hat{V}_m) \times w_m(n) \times P_m(\theta_o) \right] \quad (24)$$

Figure 4:
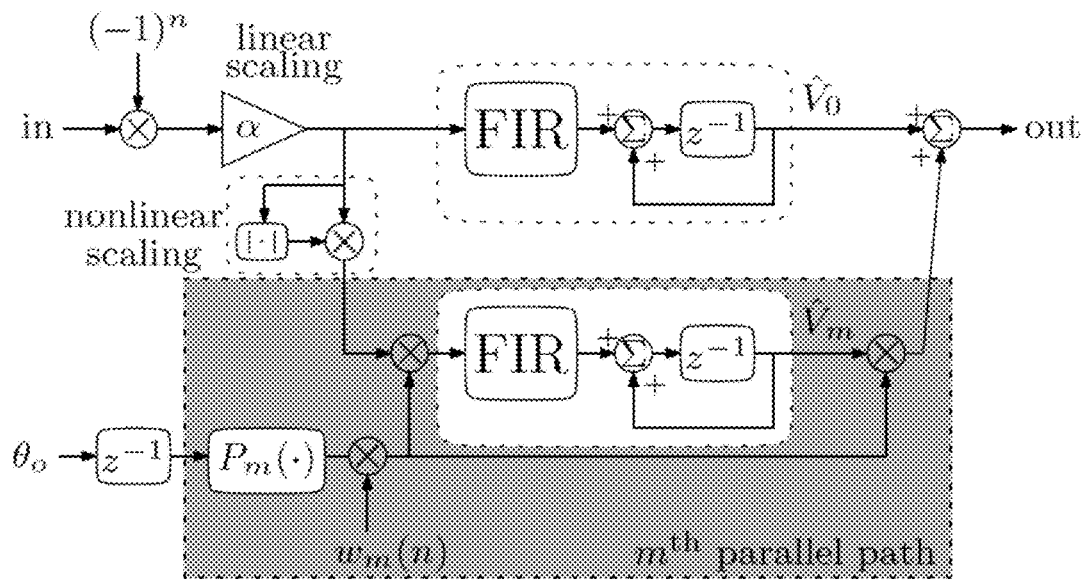
FIG. 4 illustrates another possible implementation of the offset compensation block.

Also here, a dynamic/adaptive loop may be set up for each of the different components in (23), leading to an ECB as shown in FIG. 4. In this figure, a general $m^{th}$ path has been shown, and it needs to be understood that this path may be repeated for the different values of m, and the different path outputs are added to the ECB output "out". This structure generalizes the previous FIG. 3, since now a more general periodic function $P_m(.)$ is allowed (generalizing the cos and sin functions in FIG. 3), and that also an extra modulation function $w_m(n)$ is introduced (which may be equal to one, as was the case in FIG. 3). It is understood that whenever the modulation function $w_m(n)$ is a constant, the associated modulation can be replaced by a simple gain or this modulation can be only implicitly present, e.g. when the gain is one.

A separate discussion is now provided on the residual offset of Hall elements. Residual offset of a Hall element is the incomplete cancellation of the HE offsets that occur in four-phase spinning. Residual offset may, for instance, be attributed to the (mild) non-linear behaviour of the HEs, e.g. through voltage-dependent changes of the plate thickness (also referred to as back-bias effect). Referring to the model of expression (17), the residual offsets of the $k^{th}$ Hall element is represented by $Z_k$. The last equation in (19) defines the residual offset as a function of the offsets that occur in the four phases. Unfortunately, the spinning scheme (as described above) is unable to separate the residual offset of a Hall element from the magnetic-field related signal component, i.e. both occupy basically the same frequency range. This means that error components related to residual offset may require a different approach compared to those error components which are at different frequencies compared to the main tracking loop signals.

So, the derived models and equations as described above are revisited to identify the parts that relate to residual offset. According to (21), non-zero residual offsets $Z_k$ may give rise to non-zero coefficients $V_7$ and $V_8$ in the model (20). It can be checked that the term proportional to $V_7 - \hat{V}_7$ in the expression of E given by (20) is indeed in the same frequency band as the term $(-1)^n f(\theta_i - \theta_o)$ that is associated with the operation of the main tracking loop. The same applies for the term proportional to $V_8 - \hat{V}_8$.

The implication of the above is that if a dynamic compensation path is added to the ECB for adapting $\hat{V}_7$ and/or $\hat{V}_8$, it is likely that these adaptive loops interfere with the operation of the main tracking loop. Therefore, in practice, other solutions to deal with residual offset may be considered. For instance, estimates $\hat{V}_7$ and/or $\hat{V}_8$ may be obtained from calibration data and these estimates may be used (in the same way as the adaptively estimated parameters) for compensating the residual offset components.

While the invention has been illustrated and described in detail in the drawings and foregoing description, such illustration and description are to be considered illustrative or exemplary and not restrictive. The foregoing description details certain embodiments of the invention. It will be appreciated, however, that no matter how detailed the foregoing appears in text, the invention may be practiced in many ways. The invention is not limited to the disclosed embodiments.

Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. An offset compensation circuit comprising:
   an error signal generation block arranged for receiving one or more input signals having an input phase and an equal number of feedback signals having an output phase and for generating an error signal indicative of an error between said input phase and said output phase,
   means to combine said error signal with an offset compensation signal, yielding an offset compensated signal,
   a loop filter arranged for receiving said offset compensated signal and for deriving from said offset compensation signal said output phase,
   an offset compensation block arranged for receiving said output phase and for determining said offset compensation signal, said offset compensation signal comprising at least a contribution proportional to a periodic function of said output phase,
   wherein said error signal generation block is a combiner circuit arranged to generate said error signal by combining a plurality of input signals each having a phase related to said input phase according to an array of weight factors determined based on said output phase.

2. The offset compensation circuit as in claim 1, wherein said error signal generation block is a phase detector.

3. The offset compensation circuit as in claim 1, wherein said offset compensation block comprises a digital-to-analog converter.

4. The offset compensation circuit as in claim 1, comprising chopping means arranged for applying a chopper signal to said offset compensated signal.

5. The offset compensation circuit as in claim 4, where said offset compensation block is arranged to receive said chopper signal.

6. The offset compensation circuit as in claim 1, wherein said offset compensation block comprises internal chopping means.

7. The offset compensation circuit as in claim 1, wherein said offset compensation block comprises filtering means.

8. The offset compensation circuit as in claim 1, wherein said loop filter comprises an amplifier and/or an analog filter.

9. The offset compensation circuit as in claim 1, wherein said loop filter comprises an analog-to-digital converter.

10. The offset compensation circuit as in claim 1, wherein said offset compensation block comprises a plurality of adaptive paths, each yielding a contribution to said offset compensation signal.

11. The offset compensation circuit as in claim 10, wherein said offset compensation block comprises a non-linear scaling block.

12. The offset compensation circuit as in claim 1, wherein said offset compensation block is arranged to receive a further input signal branched at a point downstream from said error signal generation block.

13. The offset compensation circuit as in claim 12, wherein said offset compensation block is arranged for receiving an output of said analog-to-digital converter.

14. The offset compensation circuit as in claim 1, wherein said offset compensation signal is at least in part determined based on calibration data.

15. The offset compensation circuit as in claim 1, wherein said input signals are sinusoidal input signals which are periodic functions of said input phase.

16. The offset compensation circuit as in claim 15, wherein said feedback signals are periodic functions of said output phase.

17. An offset compensation circuit comprising:
an error signal generation block arranged for receiving one or more input signals having an input phase and an equal number of feedback signals having an output phase and for generating an error signal indicative of an error between said input phase and said output phase,
means to combine said error signal with an offset compensation signal, yielding an offset compensated signal,
a loop filter arranged for receiving said offset compensated signal and for deriving from said offset compensation signal said output phase, and
an offset compensation block arranged for receiving said output phase and for determining said offset compensation signal, said offset compensation signal comprising at least a contribution proportional to a periodic function of said output phase,
the offset compensation circuit further comprising chopping means arranged for applying a chopper signal to said offset compensated signal.

18. An offset compensation circuit comprising:
an error signal generation block arranged for receiving one or more input signals having an input phase and an equal number of feedback signals having an output phase and for generating an error signal indicative of an error between said input phase and said output phase,
means to combine said error signal with an offset compensation signal, yielding an offset compensated signal,
a loop filter arranged for receiving said offset compensated signal and for deriving from said offset compensation signal said output phase, and
an offset compensation block arranged for receiving said output phase and for determining said offset compensation signal, said offset compensation signal comprising at least a contribution proportional to a periodic function of said output phase,
wherein said offset compensation block comprises a plurality of adaptive paths, each yielding a contribution to said offset compensation signal.

* * * * *